(12) United States Patent
Lee et al.

(10) Patent No.: US 6,184,126 B1
(45) Date of Patent: Feb. 6, 2001

(54) FABRICATING METHOD OF DUAL DAMASCENE

(75) Inventors: Tzung-Han Lee, Taipei; Li-Chieh Chao, Taoyuan Hsien, both of (TW)

(73) Assignee: United Microelectronics Corp., Hsinchu (TW)

(*) Notice: Under 35 U.S.C. 154(b), the term of this patent shall be extended for 0 days.

(21) Appl. No.: 09/137,351

(22) Filed: Aug. 20, 1998

(30) Foreign Application Priority Data

Jun. 8, 1998 (TW) .................................................. 87109056

(51) Int. Cl.[7] .............................................. H01L 21/4763
(52) U.S. Cl. ......................... 438/637; 438/638; 438/639; 438/640; 438/623; 438/624; 438/631; 438/653; 438/666; 438/672
(58) Field of Search .................................. 438/623, 624, 438/629, 631, 637, 638, 639, 640, 643, 653, 666, 668, 672

(56) References Cited

U.S. PATENT DOCUMENTS

| | | | |
|---|---|---|---|
| 5,821,169 | * 10/1998 | Nguyen et al. | 438/736 |
| 5,854,119 | * 12/1998 | Wu et al. | 438/396 |
| 5,874,201 | * 2/1999 | Licata et al. | 430/314 |
| 5,916,823 | * 6/1999 | Lou et al. | 438/738 |
| 5,985,753 | * 11/1999 | Yu et al. | 438/637 |
| 5,990,015 | * 11/1999 | Lin et al. | 438/706 |
| 6,001,414 | * 12/1999 | Huang et al. | 427/96 |
| 6,008,114 | * 12/1999 | Li | 438/618 |
| 6,017,817 | * 1/2000 | Chung et al. | 438/637 |
| 6,027,994 | * 2/2000 | Huang et al. | 438/618 |
| 6,037,664 | * 3/2000 | Zhao et al. | 257/758 |

* cited by examiner

*Primary Examiner*—John F. Niebling
*Assistant Examiner*—Lynne A. Gurley
(74) *Attorney, Agent, or Firm*—Hickman Coleman & Hughes, LLP

(57) ABSTRACT

A method of dual damascene includes forming a first conducting layer on a substrate, which already contains formed devices, and then forming a first dielectric layer and a hard material layer on the first conducting layer. The hard material layer contains a first opening, which is located right over the first conducting layer. A second dielectric layer is formed on the hard material layer, wherein the second dielectric layer is enforced by a ion implantation process or a plasma process. A hard mask layer containing a second opening is then formed on the second dielectric layer, wherein the second opening gradually widens upward, and wherein the second opening is located over the first opening. The hard mask layer is then used to pattern the second dielectric layer to expose the hard material layer. A part of the first dielectric layer is removed to expose the first conducting layer and form a third opening after a protection layer is formed on the side wall of the second dielectric layer. The third opening is then filled with a barrier layer and a second conducting layer to form a via and a conducting line.

18 Claims, 6 Drawing Sheets

FABRICATING METHOD OF DUAL DAMASCENE

CROSS-REFERENCE TO RELATED APPLICATION

This application claims the priority benefit of Taiwan application serial no. 87109056, filed Jun. 8, 1998, the full disclosure of which is incorporated herein by reference.

BACKGROUND OF THE INVENTION

1. Field of the Invention

This invention relates to a fabricating method of dual damascene, and more particularly, to a fabricating method of dual damascene that uses low-permissivity dielectric as material.

2. Description of Related Art

The cross-sectional views showing the fabrication process of a conventional fabricating method of dual damascene is shown in FIGS. 1A through 1D. As shown in FIG. 1A, in the fabrication process of a conventional fabricating method of dual damascene, a patterned conducting layer 102 is first formed on a substrate 100, wherein the substrate 100 already contains formed devices (not shown). Then, a oxide layer 104 and a silicon nitride layer 106 are formed on the substrate 100 in sequence. Referring to FIG. 1B, the silicon nitride layer 106 is patterned to form an opening followed by forming an insulating layer 108 over the substrate 100. An anisotropic dry etching process is performed to pattern the insulating layer 108 by using a photoresist layer whereon (not shown). In the meantime, a portion of the oxide layer 104 that is not covered by the patterned silicon nitride layer 106a is also stripped by the anisotropic dry etching process to expose the conducting layer 102. A trench 110b is then formed in insulating layer 108a, and a hole 110a is formed within patterned oxide layer 104a and insulating layer 108a, as shown in FIG. 1C. Referring to FIG. 1D, a barrier layer 112 is deposited on the substrate 100 first, and then, a metal layer 114 is deposited to fill the hole 110a and trench 110b. The metal layer 114 on the insulating layer 108a is removed by a chemical mechanical polishing process to form a via 114a, and conducting lines 114b and 114c in the hole 110a and trench 110b.

Since the design rule of semiconductor devices gradually evolves toward the fabrication process of 0.25 μm, the widths of the via 114a, conducting lines 114b and 114c become accordingly narrower. The distance between conducting lines 114b and 114c is shortened as well. Therefore, the conducting lines 114b and 114c, and the insulating layer 108a between the conducting lines 114b and 114c behave like a capacitor which generates a undesired current, wherein the current disturbs the functions of the conducting lines 114b and 114c, and further causes RC delay that suppresses the efficiency of the device.

Moreover, in the step of forming the barrier layer 112, a downsized opening 110a worsens the step coverage of the barrier layer 112, as shown in FIG. 2. The protuberances of the barrier layer 112 further increase the difficulty on the follow-up deposition process.

SUMMARY OF THE INVENTION

It is therefore an objective of the present invention to provide a method of dual damascene that forms a material of low permissivity between the conducting lines to avoid the capacitor effect caused by two conducting lines in close proximity. An enforcement process is applied on the low-permissivity material, wherein the exposed portion of the low-permissivity material is further covered by a protection layer.

In addition, a hard mask layer is formed on the low-permissivity material, wherein the hard mask layer contains openings that gradually widen upward to ensure that the openings are not choked by the subsequently deposited material. The hard mask layer can be further used as a stop for the chemical mechanical polishing process.

In accordance with the foregoing and other objectives of the present invention, the invention provides a method of dual damascene that includes forming a first conducting layer on a substrate, which already contains formed devices, forming a first dielectric layer and a hard material layer on the first conducting layer. The hard material layer contains a first opening, which is located right over the first conducting layer. A second dielectric layer is formed on the hard material layer, wherein the second dielectric layer is enforced by a ion implantation process or a plasma process. A hard mask layer containing a second opening is then formed on the second dielectric layer, wherein the second opening is gradually wider upward, and wherein the second opening is located over the first opening. The hard mask layer is then used to pattern the second dielectric layer to expose the hard material layer. A part of the first dielectric layer is removed to expose the first conducting layer and form a third opening after a protection layer is formed on the side wall of the second dielectric layer. The third opening is then filled with a barrier layer and a second conducting layer to form a via and a conducting line. The gradually widening upward second opening ensures the smoothness of the processes of depositing the barrier layer and the second conducting layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new fabricating method of dual damascene as shown in FIGS. 3A through 3G.

Figure 1A:
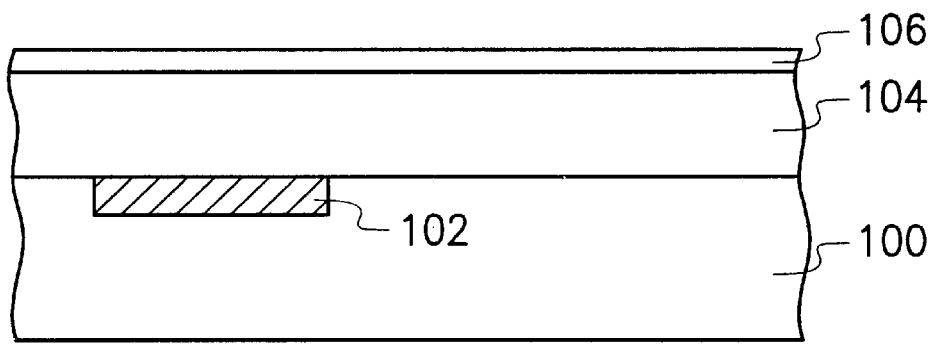
FIGS. 1A through 1D are cross-sectional views showing the fabrication process of a conventional fabricating method of dual damascene.
Figure 1B:
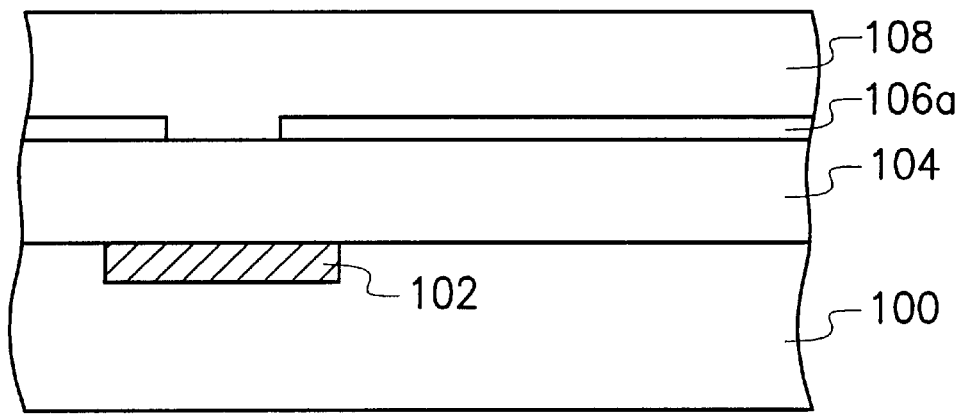
Figure 1C:
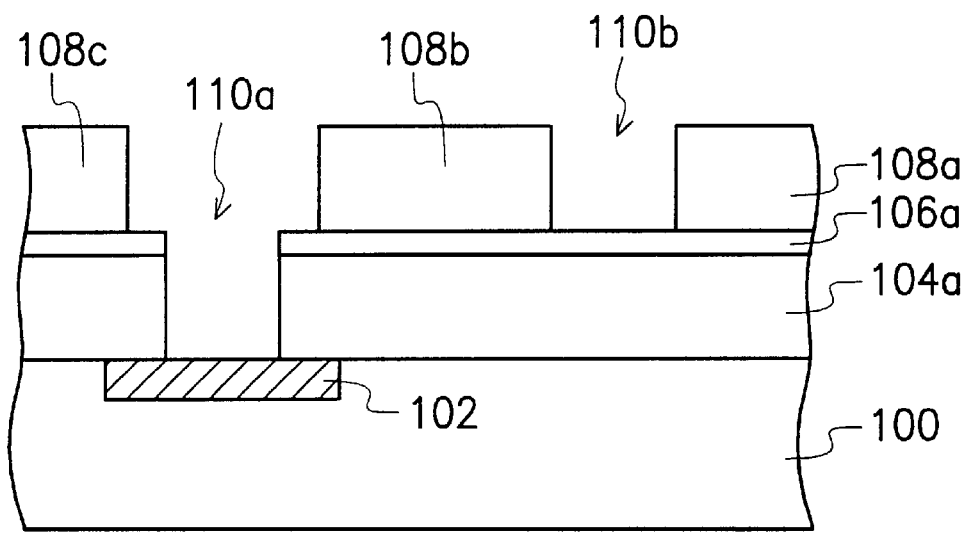
Figure 1D:
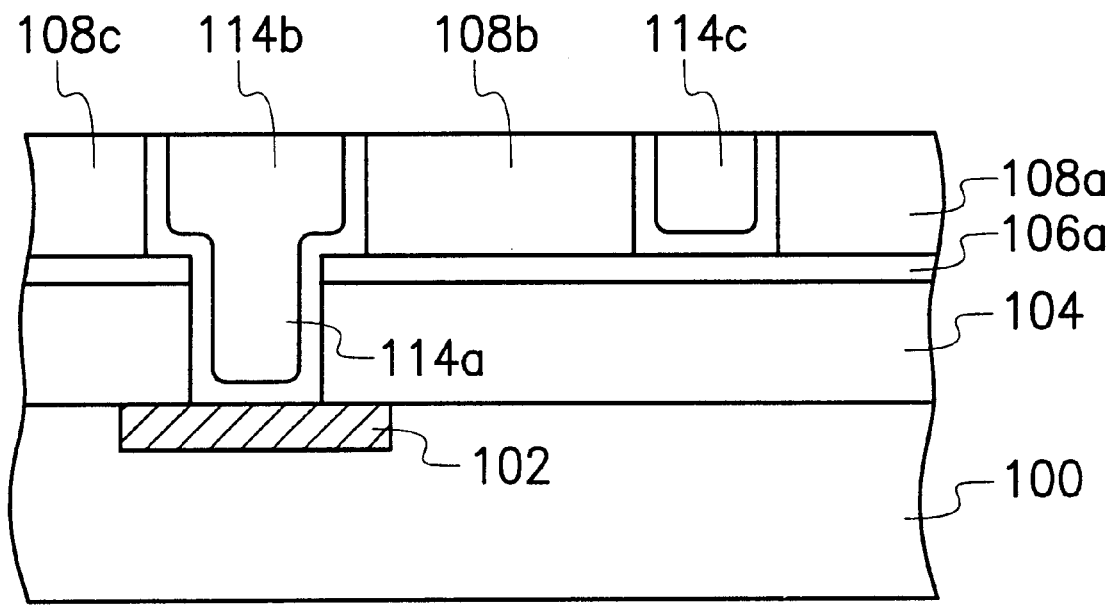
Figure 2:
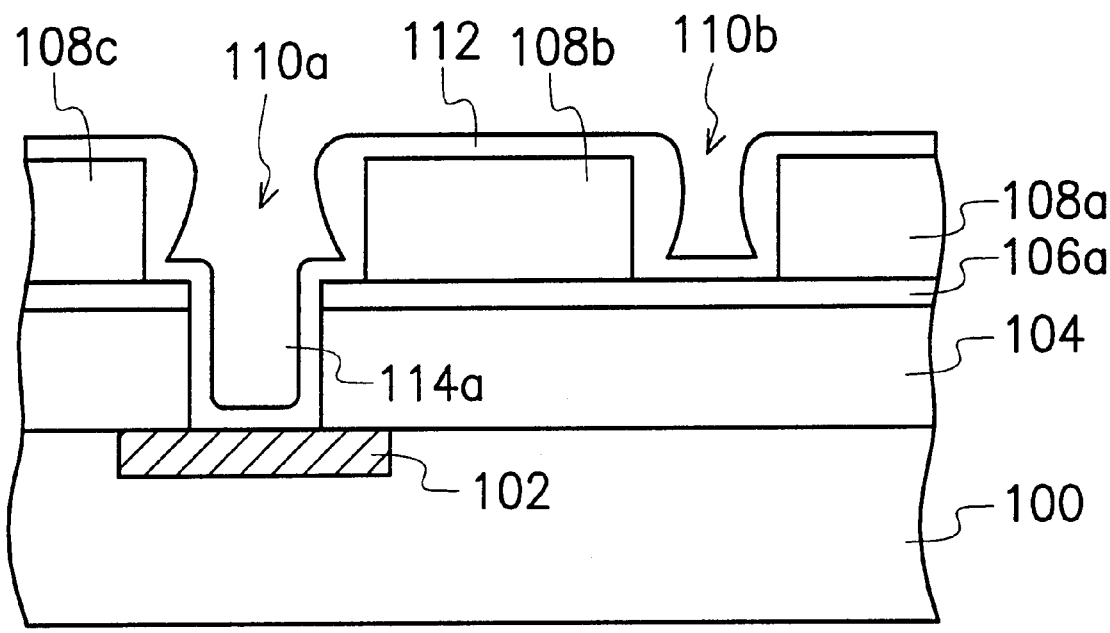
FIG. 2 is a cross-sectional view showing the architecture of a conventional dual damascene.
Figure 3A:
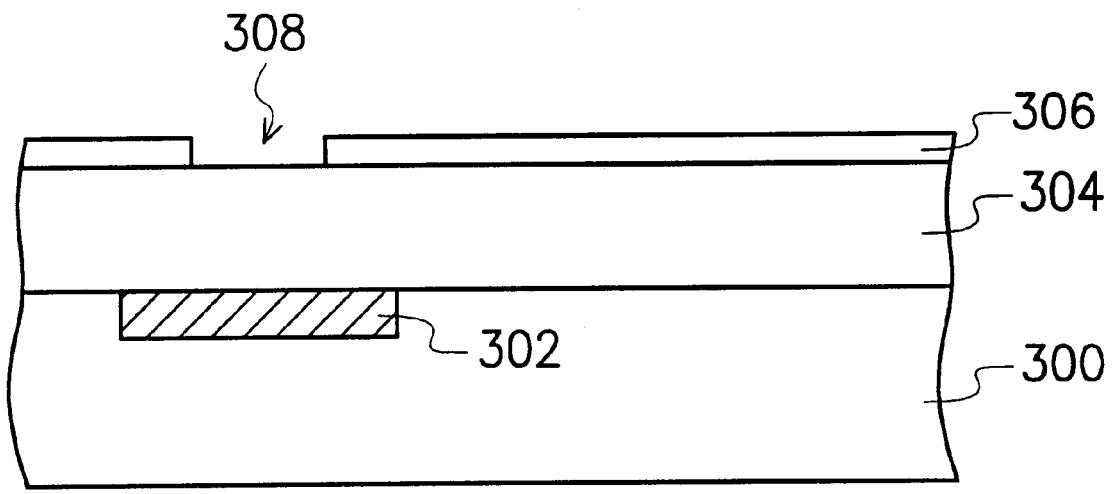
FIGS. 3A through 3G are cross-sectional views showing the fabricating method of dual damascene of a preferred embodiment according to the invention.

In FIG. 3A, a conducting layer 302 is formed on a substrate 300 and patterned, wherein the substrate 300 contains devices (not shown), such as a MOS transistor. A dielectric layer 304 is formed on the substrate 300, wherein the dielectric layer includes oxide or a material of a low permissivity. Then, a layer of a hard material 306 is formed on the dielectric layer 304, wherein the hard material layer 306 contains a opening 308 located right over the location of the conducting layer 302.

Figure 3B:
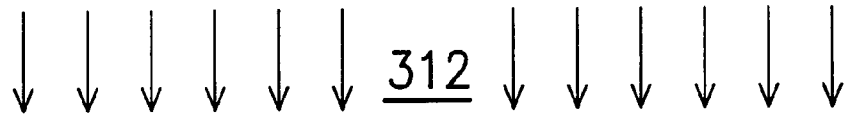
Figure 3B:
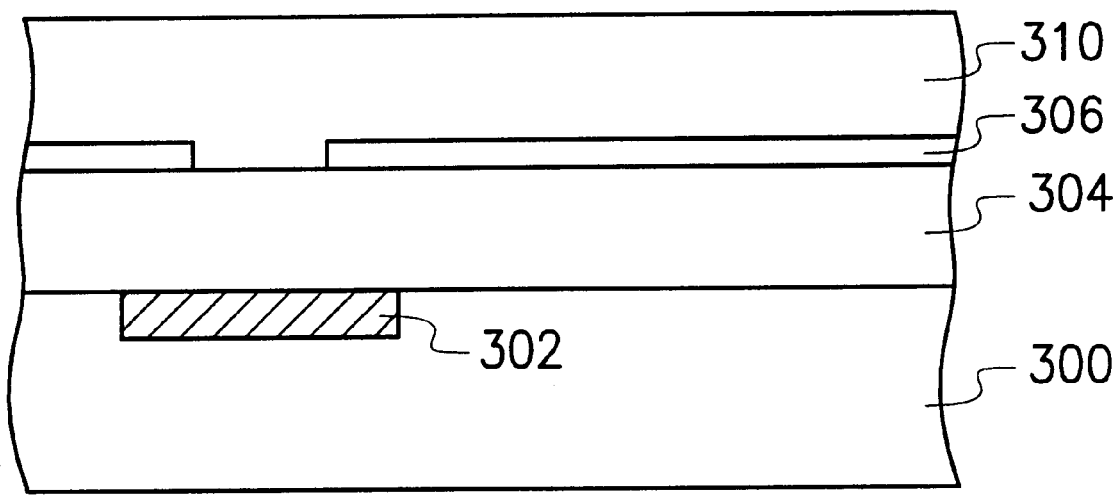

Next, another dielectric layer 310 is formed on the hard material layer 306, as shown in FIG. 3B, wherein the dielectric layer 310 includes field oxide (FOX) or a spin-on material. Because air has a pretty low permissivity, the dielectric layer 310 is made to be cavernous in order to obtain a lower permissivity. On the other hand, the cavernous dielectric layer 310 is relatively weak and incompact. In order to prevent the dielectric layer 310 from damages caused by the follow-up process, an ion implantation process or a plasma process is performed to enforce the dielectric layer 310. The ions used in the implantation process include arsenic ions or phosphorus ions. The plasma used in the plasma process includes arsenic plasma, $N_2$, or $N_2O$.

Figure 3C:
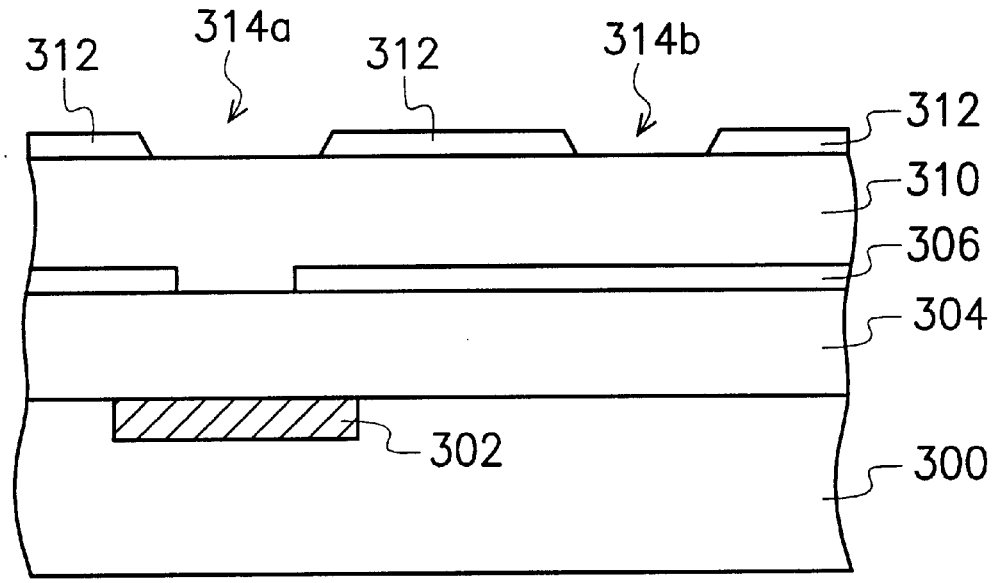
Figure 3D:
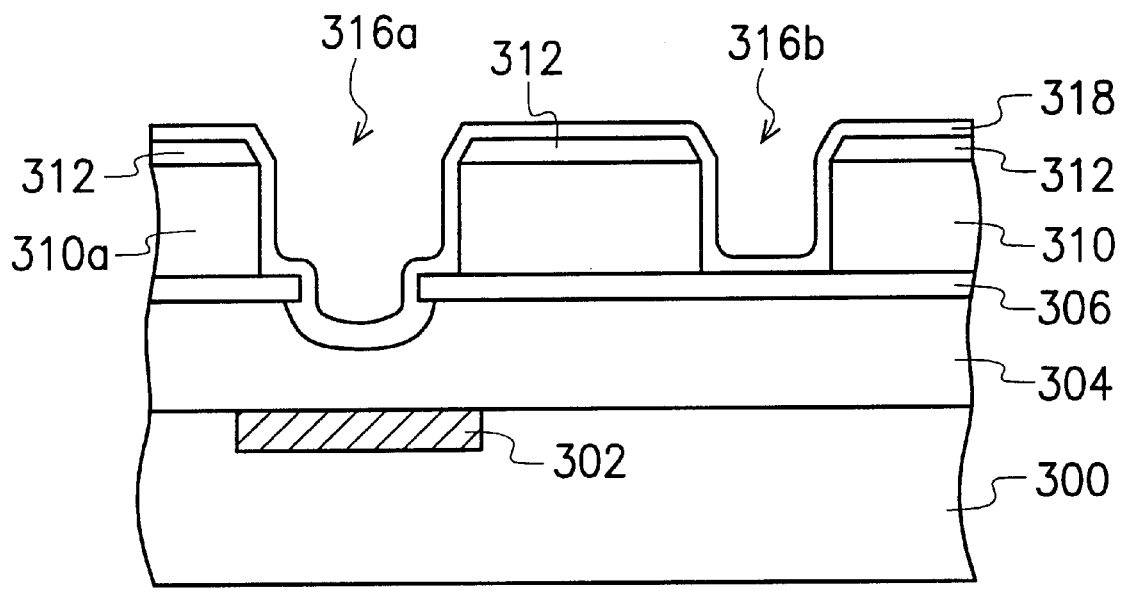

In FIG. 3C, a hard mask layer 312 is formed on the dielectric layer 310, which contains openings 314a and 314b, wherein the hard mask layer includes silicon nitride, and wherein the opening 314a is located right over the location of the conducting layer 302. The openings 314a and 314b both gradually widen upward.

Figure 3E:
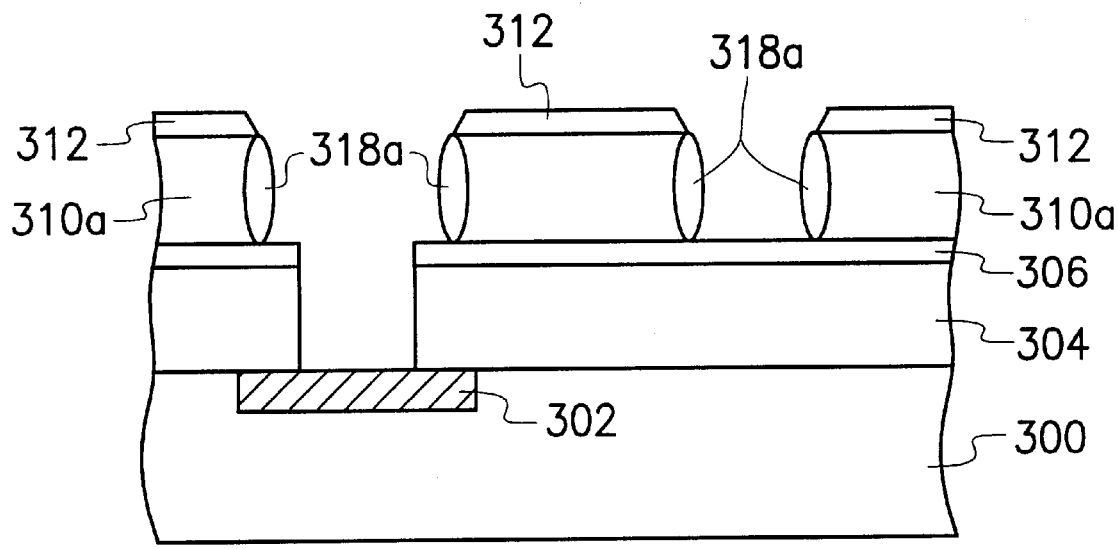

Next, by using the hard mask layer 312 as an etching mask and the hard material layer 306 as an etching stop, a etching process is performed to remove a part of the dielectric layer 310 to expose the hard material layer 306 and the dielectric layer 304, and form openings 316a and 316b. A protection layer 318 is next to be formed on the hard mask layer 312 and the openings 316a and 316b, wherein the protection layer 318 includes silicon oxide or silicon oxynitride. An etching back process is then performed to remove the protection layer 318 from the surfaces of the hard mask layer 312, hard material layer 306, and dielectric layer 310a. The hard material layer is further used as a mask to remove part of the dielectric layer 304 to expose the conducting layer 302 and form opening 320a and 320b, as shown in FIG. 3E. Remaining protecting layer 318a used on the sidewalls of the openings 320a and 320b to protect the dielectric layer 310 from over-etching.

If the dielectric layer 304 also includes a low-permissivity material, then it is necessary that the protection layer 318a cover the exposed portion and the sidewalls of the dielectric layer 304.

Figure 3F:
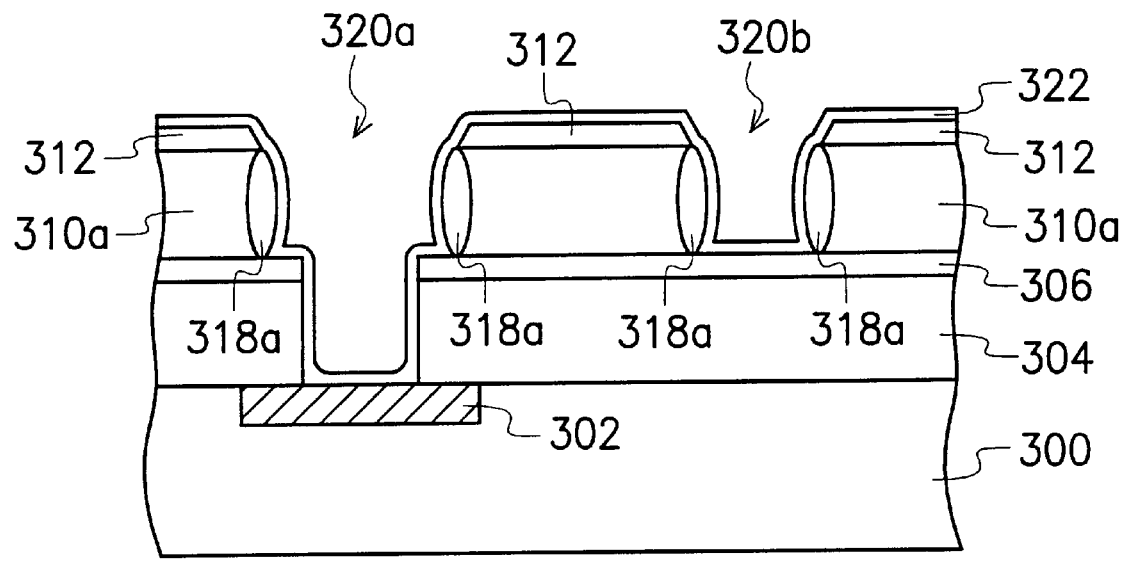
Figure 3G:
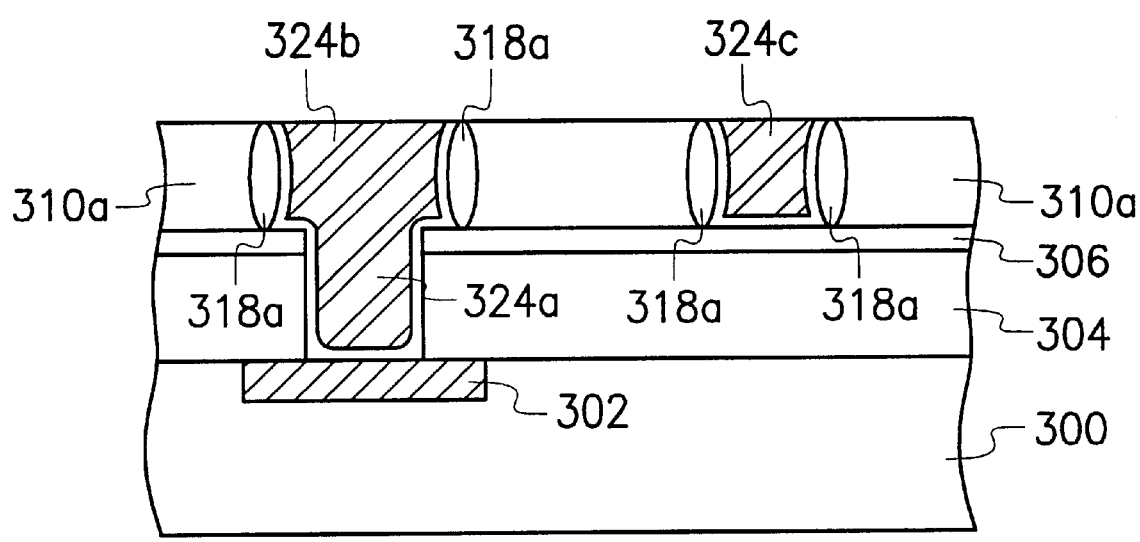

In FIG. 3F, barrier layer 322 is formed on the hard mask layer 312, and the exposed surfaces of the openings 320a and 320b. Because the openings 320a and 320b gradually widen upward, the openings are protected from being choked by the deposited material in the follow-up process. A conducting layer 324 is next to be formed on the barrier layer 322 and the hard mask layer 312, and fills the opening 320a and 320b. The barrier layer 322 and conducting layer 324 on the top of the hard mask layer 312 are removed by a chemical mechanical polishing process to form a via 324a and conducting lines 324b and 324c, as shown in FIG. 3G.

Because the dielectric layer of the invention is made of a low-permissivity material, the undesired currents are avoided between two conducting lines in close proximity. Even though the follow-up process easily damages the cavernous low-permissivity material, performing an ion implantation process or a plasma process on the cavernous material enforces the dielectric. The protection layer covering the exposed dielectric layer provides the dielectric layer further protection from over-etching.

In order to ensure the openings not to be choked by material formed by the follow-up process, a hard mask layer is formed on the dielectric layer, wherein the hard mask layer contains openings that are widened gradually upward. The hard mask layer is also used as a stop layer in the chemical mechanical polishing process applied on the conducting layer.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabricating method of dual damascene, performed on a substrate, wherein the substrate contains a patterned conducting layer and devices, the method at least comprising:

forming a first dielectric layer on the substrate and the conducting layer;

forming a hard material layer on the first dielectric layer, wherein the hard material layer comprises a first opening located right over the conducting layer to expose the first dielectric layer;

forming a second dielectric layer on the hard material layer, wherein the second dielectric layer has a low-permissivity;

performing an enforcement process on the second dielectric layer to make the second dielectric layer solid;

forming a hard mask layer on the second dielectric layer, wherein the hard mask layer comprises a second opening located right over the first opening, and wherein the second opening has a profile that gradually widens upward;

performing an etching process on the second dielectric layer, by using the hard mask layer as an etching mask and the hard material layer as a etching stop, to remove a first portion of the second dielectric layer and expose the hard material layer;

forming a protection layer on the substrate;

performing an etching back process on the protection layer to leave at least a second portion of the protection layer located on a sidewall of the second dielectric layer, wherein the etching back process also removes a third portion of the first dielectric layer to form a third opening that exposes the conducting layer;

forming a barrier layer on the substrate; and forming a second conducting layer in the third opening.

2. The method of claim 1, wherein the step of forming the second conducting layer in the third opening further comprises performing a chemical mechanical polishing process to remove a portion of the second conducting layer and the barrier layer located on the top of the hard mask layer, by using the hard mask layer as a polishing stop.

3. The method of claim 1, wherein the enforcement process includes an ion implantation process.

4. The method of claim 3, wherein the ion implantation process implants one of the group consisting of arsenic ions and phosphorus ions.

5. The method of claim 1, wherein the enforcement process includes a plasma process.

6. The method of claim 5, wherein the plasma process uses a plasma of one of the group consisting of arsenic, $N_2$, and $N_2O$.

7. The method of claim 1, wherein the first dielectric layer includes a low-permissivity material.

8. The method of claim 1, wherein the protection layer includes silicon oxide.

9. The method of claim 1, wherein the protection layer includes silicon oxynitride.

10. A fabricating method of dual damascene, performed on a substrate, wherein the substrate contains a patterned conducting layer and devices, the method at least comprising:

forming a first dielectric layer on the substrate and the conducting layer;

forming a hard material layer on the first dielectric layer;

forming a second dielectric layer on the hard material layer, wherein the second dielectric layer has a low-permissivity;

performing an enforcement process on the second dielectric layer to make the second dielectric layer solid;

forming a hard mask layer on the second dielectric layer, wherein the hard mask layer comprises a first opening, and wherein the first opening has a profile that gradually widens upward;

performing an etching process on the second dielectric layer, by using the hard mask layer as an etching mask and the hard material layer as a etching stop, to remove a first portion of the second dielectric layer and to form a second opening in the second dielectric layer to expose the hard material layer;

forming a protection layer on the substrate;

performing an etching back process on the protection layer to leave at least a second portion of the protection layer located on a sidewall of the second opening;

forming a barrier layer on the substrate; and forming a second conducting layer in the second opening.

11. The method of claim 10, wherein the step of forming the second conducting layer in the second opening further comprises performing a chemical mechanical polishing process to remove the second conducting layer and the barrier layer from a top of the hard mask layer, by using the hard mask layer as a polishing stop.

12. The method of claim 10, wherein the enforcement process includes an ion implantation process.

13. The method of claim 12, wherein the ion implantation process implants one of the group consisting of arsenic ions and phosphorus ions.

14. The method of claim 10, wherein the enforcement process includes a plasma process.

15. The method of claim 14, wherein the plasma process uses a plasma of one of the group consisting of arsenic, $N_2$, and $N_2O$.

16. The method of claim 10, wherein the first dielectric layer includes a low-permissivity material.

17. The method of claim 10, wherein the protection layer includes silicon oxide.

18. The method of claim 10, wherein the protection layer includes silicon oxynitride.

* * * * *